United States Patent
Deng et al.

(10) Patent No.: US 8,618,876 B2
(45) Date of Patent: Dec. 31, 2013

(54) REDUCED POWER-CONSUMPTION TRANSMITTERS

(75) Inventors: Junxiong Deng, San Diego, CA (US); Gurkanwal Singh Sahota, San Diego, CA (US); Prashanth Akula, San Diego, CA (US); Thomas Marra, San Diego, CA (US); Vladimir Aparin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1079 days.

(21) Appl. No.: 12/130,729

(22) Filed: May 30, 2008

(65) Prior Publication Data
US 2012/0236958 A1 Sep. 20, 2012

(51) Int. Cl.
*H03F 1/14* (2006.01)

(52) U.S. Cl.
USPC .............................. 330/51; 330/285

(58) Field of Classification Search
USPC .................... 330/51, 285, 296, 133
See application file for complete search history.

(56) References Cited

U.S. PATENT DOCUMENTS

| | | | |
|---|---|---|---|
| 5,923,215 A | 7/1999 | Hans | |
| 6,480,700 B1 | 11/2002 | Groe et al. | |
| 6,515,541 B2 | 2/2003 | Cheng et al. | |
| 6,529,716 B1 | 3/2003 | Eidson et al. | |
| 6,646,510 B2 | 11/2003 | Julien et al. | |
| 6,831,517 B1* | 12/2004 | Hedberg et al. | 330/285 |
| 6,859,098 B2 | 2/2005 | Husseini | |
| 7,183,856 B2* | 2/2007 | Miki et al. | 330/297 |
| 7,332,966 B2* | 2/2008 | Furuya et al. | 330/289 |
| 7,345,534 B2 | 3/2008 | Grebennikov | |
| 7,528,648 B2* | 5/2009 | Raimar | 327/543 |
| 7,715,810 B2* | 5/2010 | Brobston | 455/114.2 |
| 7,933,567 B2* | 4/2011 | Guda et al. | 455/126 |
| 8,014,740 B2* | 9/2011 | Rofougaran | 455/127.3 |
| 2005/0090210 A1 | 4/2005 | Hamada | |
| 2009/0215413 A1* | 8/2009 | Ahn et al. | 455/127.1 |

FOREIGN PATENT DOCUMENTS

| | | |
|---|---|---|
| EP | 0717492 A1 | 6/1996 |
| EP | 1793505 A2 | 6/2007 |
| GB | 2280325 | 1/1995 |
| JP | 2003510882 A | 3/2003 |
| JP | 2006500884 A | 1/2006 |
| JP | 2006511143 A | 3/2006 |
| JP | 2007005996 A | 1/2007 |
| JP | 2007228360 A | 9/2007 |
| JP | 2008048321 A | 2/2008 |
| WO | WO03085849 A1 | 10/2003 |
| WO | WO2004032317 | 4/2004 |

OTHER PUBLICATIONS

International Search Report and Written Opinion—PCT/US2009/045736, International Search Authority—European Patent Office—Sep. 7, 2009.
Manku T, "Removing the interstage Transmit SAW in WCDMA," RFDESIGN, pp. 32-36, Feb. 2007.
Taiwan Search Report—TW098118085—TIPO—Jul. 9, 2012.

* cited by examiner

*Primary Examiner* — Henry Choe
(74) *Attorney, Agent, or Firm* — Ramin Mobarhan

(57) ABSTRACT

An exemplary embodiment discloses a digital control block for dynamically regulating power consumption of the transmitter; and a first driver amplifier circuit comprising a plurality of bias-modes each corresponding to a power consumption level in the transmitter, the digital control block to instruct the first driver amplifier circuit to operate in a selected bias-mode to regulate power consumption of the transmitter.

30 Claims, 7 Drawing Sheets

REDUCED POWER-CONSUMPTION TRANSMITTERS

FIELD

The present disclosure relates generally to transmitter, and more specifically to techniques for reducing power consumption in radio frequency (RF) transmitter.

BACKGROUND

In a communication system, a transmitter receives a base-band signal from a mobile station modem (MSM), up-converts the base-band signal to radio-frequency (RF) using one or more mixers, then amplifies the RF signal, such as via driver amplifiers and power amplifiers, for transmission via an antenna.

Power efficiency is important in advanced wireless applications, especially in handset devices because better power efficiency generally means longer talk time for the handset user. A bottleneck of the power efficiency in wireless transceivers is the transmitter. Among the transmitter blocks, the largest power consumers are the amplifiers which include driver amplifier (DA) and power amplifier (PA). Other transmitter blocks along a transmit path also contribute to the overall power consumption of the transmitter.

Accordingly, there is a need in the art for reducing the power consumption in transmitter blocks of transmitters of wireless devices.

DETAILED DESCRIPTION

The techniques described herein are applicable to and may be used for any electronic setting in any electrical or electronic environment in which radio frequency reception is desired. For exemplary purposes only, the exemplary embodiments described herein are presented in the context of a wireless communication environment, though they are not meant to be limited to such, but applicable to any wire or wireless communication setting which use radio-frequency transmission and reception, such as cell-phones, base-stations as well as cable set-top boxes and the likes.

The techniques described herein may be used for various wireless communication networks such as wireless communication networks such as CDMA, TDMA, FDMA, OFDMA and SC-FDMA networks. The terms "network" and "system" are often used interchangeably. A CDMA network may implement a radio technology such as Universal Terrestrial Radio Access (UTRA), cdma2000, etc. UTRA includes Wideband-CDMA (W-CDMA), Low Chip Rate (LCR), High Chip Rate (HCR), etc. CDMA2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. These various radio technologies and standards are known in the art. UTRA, E-UTRA and GSM are described in documents from an organization named "3rd Generation Partnership Project" (3GPP). CDMA2000 is described in documents from an organization named "3rd Generation Partnership Project 2" (3GPP2). 3GPP and 3GPP2 documents are publicly available. For clarity, certain aspects of the techniques are described below for 3GPP networks.

The word "exemplary" is used herein to mean "serving as an example, instance, or illustration." Any embodiment described herein as "exemplary" is not necessarily to be construed as preferred or advantageous over other embodiments.

Figure 1:
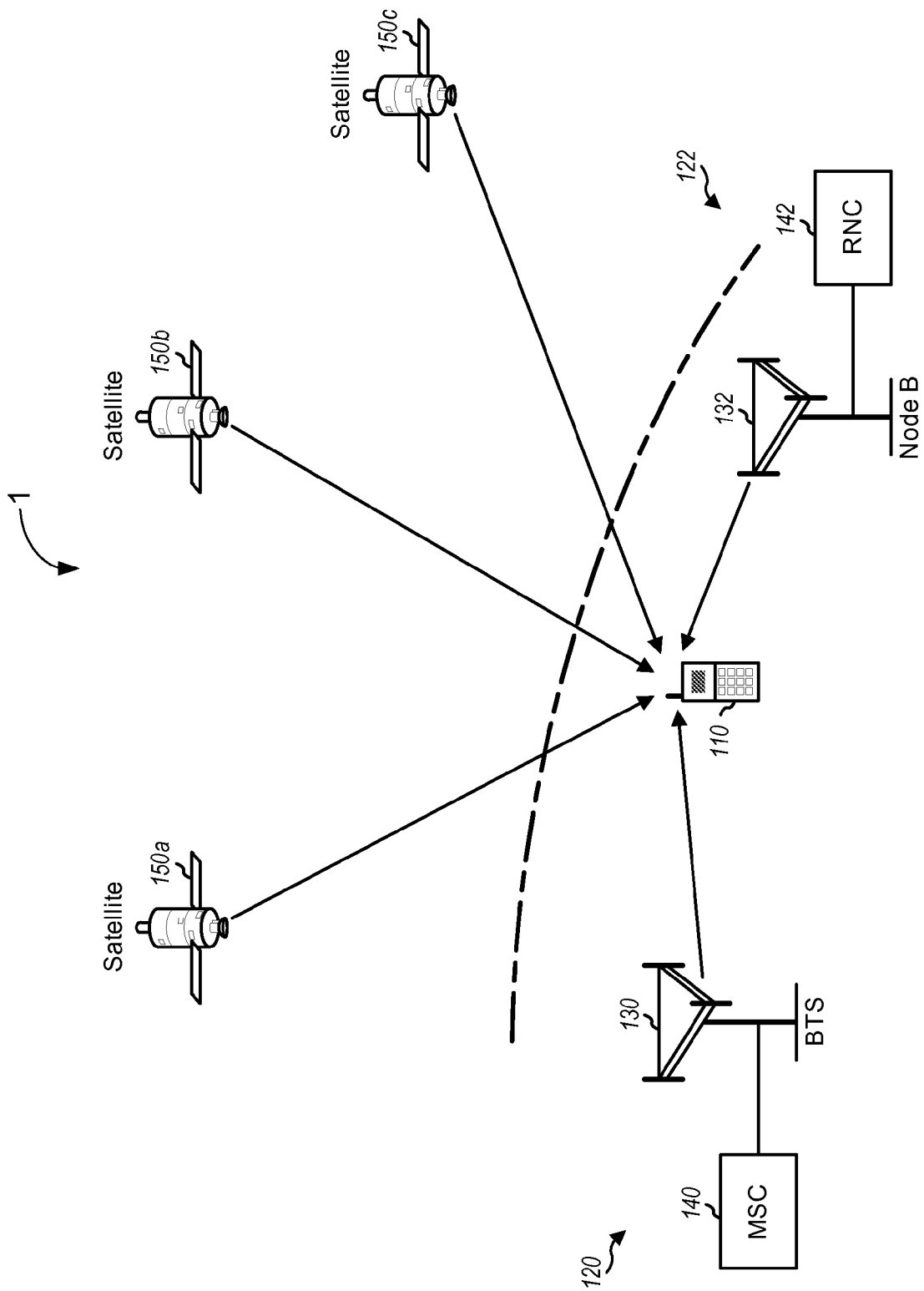
FIG. 1 illustrates an exemplary wireless communication environment in which exemplary embodiments of the disclosure can be practiced.

FIG. 1 illustrates an exemplary wireless communication environment 1 comprising communication systems 120 and 122 and a wireless device 110, such as a multi-antenna wireless device capable of communicating with multiple wireless communication systems 120 and 122. Wireless system 120 may be a CDMA system that may implement one or more CDMA standards such as, e.g., IS-2000 (commonly referred to as CDMA 1x), IS-856 (commonly referred to as CDMA 1x EV-DO), IS-95, W-CDMA, and so on. Wireless system 120 includes a base transceiver system (BTS) 130 and a mobile switching center (MSC) 140. BTS 130 provides over-the-air communication for wireless devices under its coverage area. MSC 140 couples to BTSs in wireless system 120 and provides coordination and control for these BTSs. Wireless system 122 may be a TDMA system that may implement one or more TDMA standards such as, e.g., GSM. Wireless system 122 includes a Node B 132 and a radio network controller (RNC) 142. Node B 132 provides over-the-air communication for wireless devices under its coverage area. RNC 142 couples to Node Bs in wireless system 122 and provides coordination and control for these Node Bs. In general, BTS 130 and Node B 132 are fixed stations that provide communication coverage for wireless devices and may also be referred to as base stations or some other terminology. MSC 140 and RNC 142 are network entities that provide coordination and control for the base stations and may also be referred to by other terminologies.

Wireless device 110 may be a cellular phone, a personal digital assistant (PDA), a wireless-enabled computer, or some other wireless communication unit or device. Wireless device 110 may also be referred to as a mobile station (3GPP2 terminology), a user equipment (UE) (3GPP terminology), an access terminal, or some other terminology. Wireless device 110 is equipped with multiple antennas, e.g., one external antenna and one or more internal antennas. The multiple antennas may be used to provide diversity against deleterious path effects such as fading, multi-path, interference, and so on. An RF modulated signal transmitted from an antenna at a transmitting entity may reach the multiple antennas at wireless device 110 via line-of-sight paths and/or reflected paths. At least one propagation path typically exists between the transmit antenna and each receive antenna at wireless device 110. If the propagation paths for different receive antennas are independent, which is generally true to at least an extent, then diversity increases and the received signal quality improves when multiple antennas are used to receive the RF modulated signal.

Wireless device 110 may or may not be capable of receiving signals from satellites 150. Satellites 150 may belong to a satellite positioning system such as the well-known Global Positioning System (GPS), the European Galileo system, or some other systems. Each GPS satellite transmits a GPS signal encoded with information that allows a GPS receiver on Earth to measure the time of arrival (TOA) of the GPS signal. Measurements for a sufficient number of GPS satellites may be used to obtain an accurate three-dimensional position estimate for the GPS receiver. In general, the wireless device 110 may be capable of communicating with any number of wireless systems of different wireless technologies (e.g., CDMA, GSM, GPS, and so on).

Figure 2:
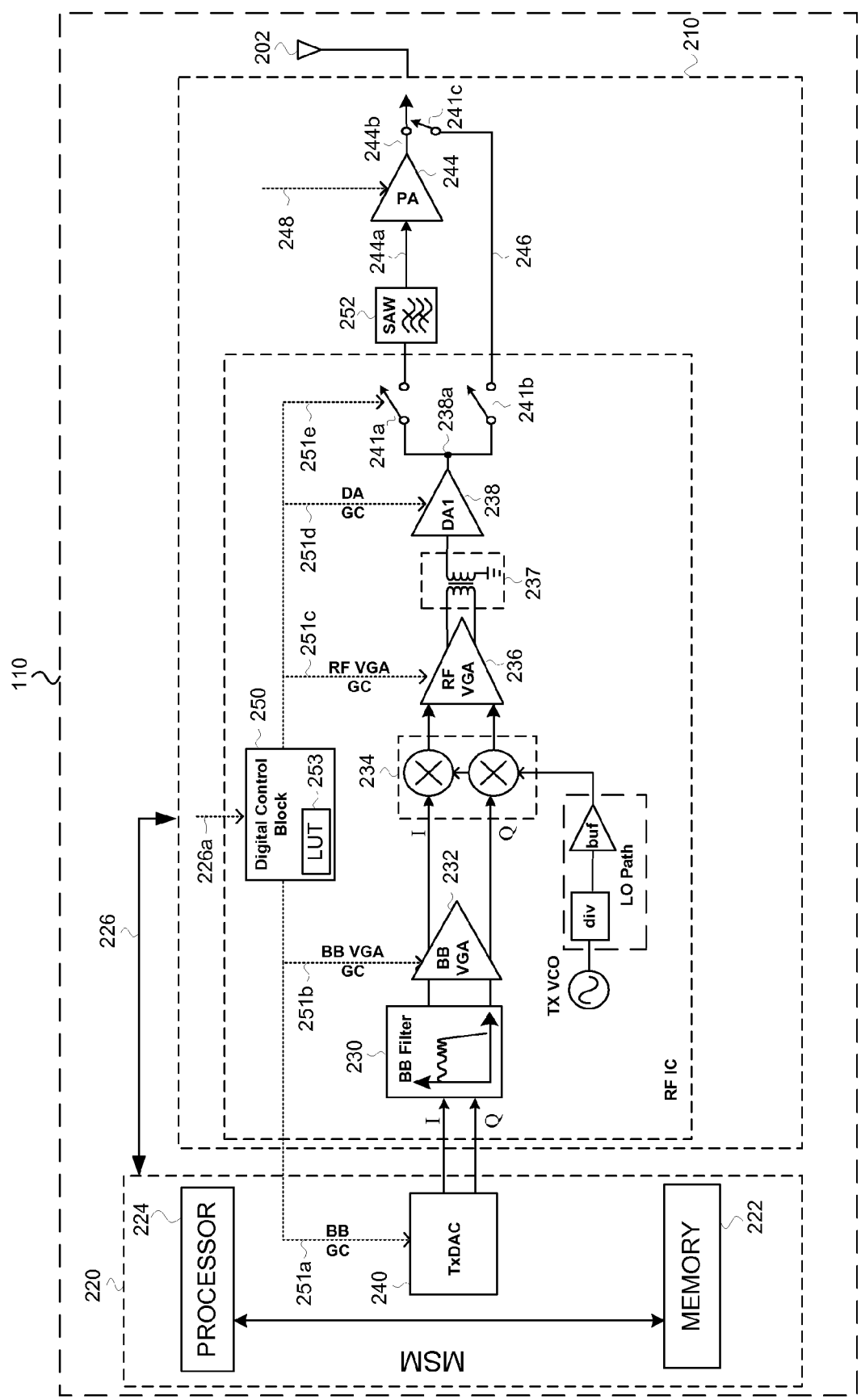
FIG. 2 illustrates an exemplary embodiment of the disclosure.

FIG. 2 is a simplified block diagram illustrating an exemplary wireless device 110. Wireless device 110 includes an exemplary radio-frequency (RF) transmitter 210, such as a SAW-filtered transmitter which at one end couples to an antenna 202, such as a main antenna, which may be an external antenna, and at the other end is in communication with a mobile station modem (MSM) 220, such as via path 226. MSM 220 comprises a processor 224 which is in communication with a memory 222.

As shown in FIG. 2, exemplary transmitter 220, such as a CDMA transmitter, includes a digital control block 250 for dynamically regulating power consumption of the transmitter 210; and a driver amplifier circuit DA1 238 having a plurality of bias-modes. Each bias-mode corresponds to a power consumption level in the transmitter 210. The digital control block 250 instructs the driver amplifier circuit DA1 238 to operate in a selected bias-mode to regulate power consumption of the transmitter 220, as described below and in greater detail conjunction with FIGS. 3A-D.

In an exemplary embodiment, transmitter 210 is designed to support a peak uplink data rate of for example 154 kbps with a bandwidth of 1.23 MHz. The transmitter 210 operates at all CDMA frequency bands, generally at high and low band such as such as PCS and Cell-bands. The transmitter 220 comprises baseband (BB) filter 230 such as a second-order BB filter, BB variable gain amplifier (VGA) 232, one or more direct up-converter 234 such as mixers, RF VGA 236, a driver amplifier (DA1) 238, and power amplifier (PA) 244.

In an exemplary embodiment, during a signal transmission the Tx digital-to-analog converter (DAC) 240 creates the quadrature differential I and Q signals with a reference current (Iref) provided by the digital control block 250. The BB I and Q signals are input to the BB filter 230, and then the filtered BB signals are mirrored with the BB VGA 232, which is switched with digital gain control as described below and in greater detail conjunction with FIGS. 3A-D. The output currents of the BB VGA are up-converted, such as by a single sideband up-converter 234 consisting of two cross-coupled Gilbert cell mixers. The output RF currents of the up-converter are applied to the input of the RF VGA 236, which is controlled through digital gain control, as described below and in greater detail conjunction with FIGS. 3A-D. The differential signal at the output of the RF VGA 236 is converted into a singled-ended signal to the input of the DA1 238 via a transformer 237. The DA1 238 is composed of digitally-controlled switched cascode stages and provides digital gain control, as described below and in greater detail conjunction with FIGS. 3A-D. A plurality of RF switches, such as 241a, 241b and 241c, positioned following the output 238a of the DA1 238 selects either normal mode output through PA circuit 244 or a PA-bypass mode through a PA-bypass path 246 output depending on the mode selecting signal 248 received from the MSM 220, as described below and in greater detail conjunction with FIGS. 3A-D.

In an exemplary embodiment, the digital control block 250 instructs a plurality of circuits, such as TxDAC 240, BB-VGA 232, RF-VGA 236 and DA1 238 for regulating power consumption of the transmitter 210. The digital control block 250 causes a reduction in a current consumption of one or more of the plurality of circuits when a transmitter output power decreases. In an exemplary embodiment, the gain control is implemented in digital discrete steps. The coarse gain control is practiced in the BB VGA 232, RF VGA 236 and DA1 238. The fine gain control in the TxDAC 240 compensates the coarse gain curve to achieve linear gain characteristic, such as 0.25 dB. Both the coarse and fine gain controls are achieved through the look-up table (LUT) 253, which can reside in the digital control block 250.

As shown in FIG. 2, the transmitter 210 includes a power amplifier (PA) circuit 244 having an input 244a for receiving an RF signal from the driver amplifier circuit DA1 238, and an output 244b for outputting an amplified RF signal. The transmitter 210 also includes a PA-bypass path 246 for connecting the output 238a of the driver amplifier circuit DA1 238 to the output of the PA circuit 244. A plurality of switches, such as 241a, 241b and 241c positioned between the output 238a of driver amplifier circuit DA1 238 and the output 244b of PA circuit 244 enable the digital control block 250 to select one of the PA-bypass path 246 or the path containing PA circuit 244. In an exemplary embodiment, the transmitter 210 also includes a surface acoustic wave (SAW) filter 252 positioned between the output 238a of the driver amplifier circuit DA1 238, such as after the switch 241a, and the input 244a of the PA circuit 244 to filter the RF signal provided to the PA circuit 244 by the driver amplifier circuit DA1 238.

In a normal exemplary operation mode (i.e. high power at the PA 244 output 244b), DA1 238 output delivers up to 7 dBm output power to the PA 244 through RF switches 241a and through a RF SAW filter 252. In the PA-bypass mode (i.e. low and mid power at the PA 244 output), DA1 238 output generates more than 9 dBm output power to the PA 244 output 244b through RF switches 241b and 241c, thus bypassing the PA 244 and achieving much better power consumption.

Figure 3A:
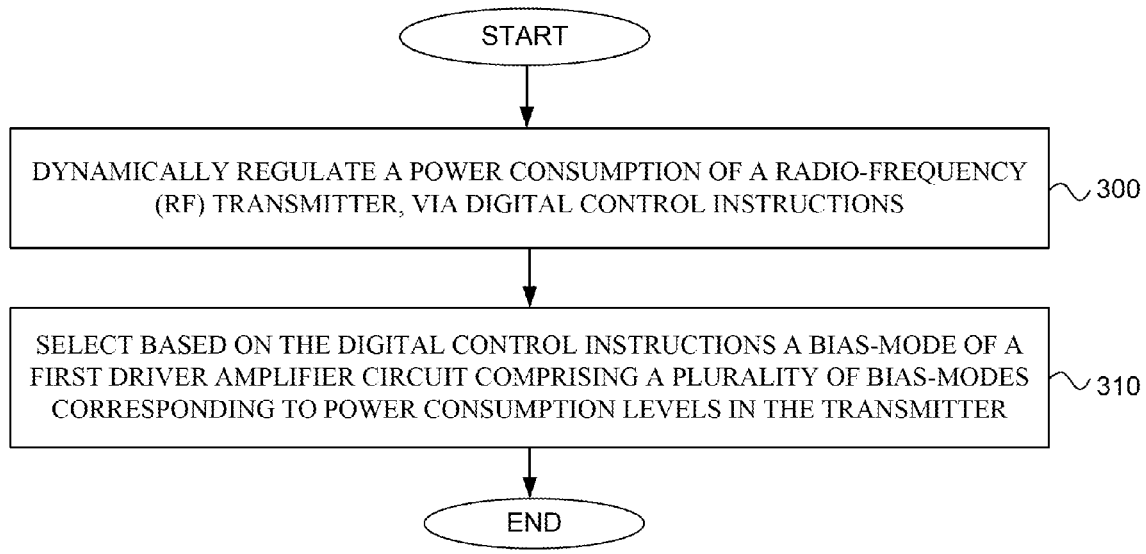
FIGS. 3A-D are flow charts illustrating exemplary methods of the disclosure.

FIGS. 3A-D are flow charts which in conjunction with FIG. 2 above illustrate exemplary methods of the disclosure. As shown in FIG. 3A, the overall process begins in block 300 where the power consumption of a radio-frequency (RF) transmitter 210 is dynamically regulated via digital control instructions, such as those received from the digital control block 250. In an exemplary embodiment, the digital control instructions include, but are not limited to: base band (BB) gain control (GC) instruction 251a to TxDAC 240, BB-VGA-GC instruction 251b to BB VGA 232, RF gain control (GC) instructions 251c RF VGA 236 and gain control (GC) instructions 251d to driver amplifier circuit DA1 238, as well as command instructions 251e for opening or closing one or more of switches 241a, 241b and 241c. In an exemplary embodiment, the control instructions 251a-e are 8-bits. Next in block 310, based on the digital control instructions 251d, a bias-mode of the driver amplifier circuit DA1 238 is selected from a plurality of bias modes of driver amplifier circuit DA1 238, such a high-bias mode or a low-bias mode. In an exemplary embodiment, the plurality of bias-modes correspond to operating power consumption levels in the driver amplifier circuit DA1 238 and therefore the overall operating power consumption levels in the transmitter 210. The overall process then ends.

Figure 3B:
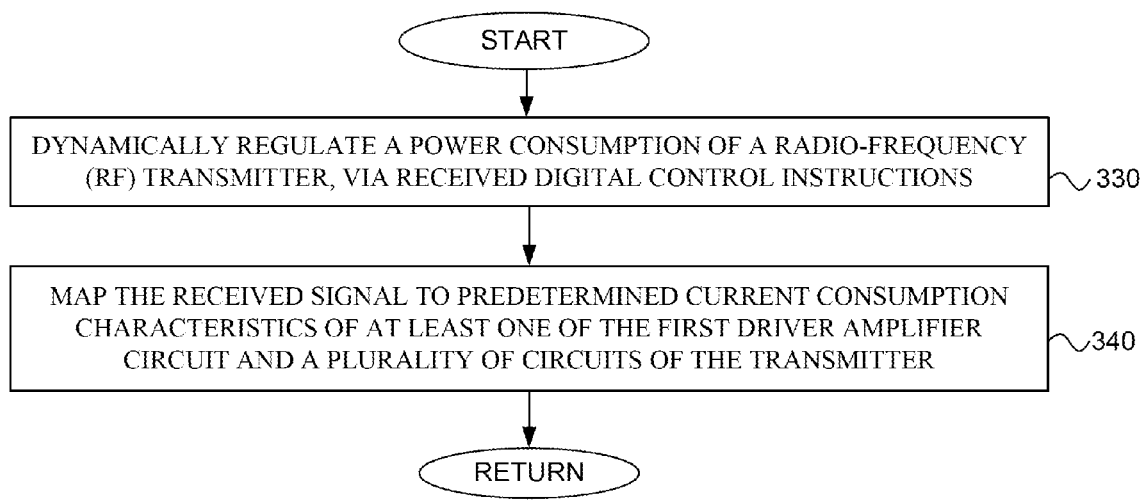

FIG. 3B is a flow chart illustrating in further detail the operations in block 300 of FIG. 3A. The process begins in block 330 in which the power consumption of a radio-frequency (RF) transmitter 210 is dynamically regulated via received digital control instructions, such as the digital control instructions 226a received in digital control block 250 from the MSM 220. In an exemplary embodiment, the received digital control instructions 226a are 8-bits.

Next, in block 340, the received signal 262*a* is mapped by the digital control block 250 to predetermined current consumption characteristics of one or more of: the TxDAC 240, BB VGA 232, RF VGA 236 and driver amplifier circuit DA1 238. The mapping determines at what current level should each of the TxDAC 240, BB VGA 232, RF VGA 236 and driver amplifier circuit DA1 238 operate so that the overall power consumption of the transmitter 210 be in line with the power consumption level requested by the MSM 220 via the received signal 262*a*. In an exemplary embodiment, a look up table (LUT) 253, which may be internal or external to digital control block 250 is used for the mapping.

In an exemplary embodiment, one or more of the TxDAC 240, BB VGA 232, RF VGA 236 and driver amplifier circuit DA1 238 have a plurality of gain stages, such as three or more which correspond to a set of transistors in the TxDAC 240, BB VGA 232, RF VGA 236 and driver amplifier circuit DA1 238. In an exemplary embodiment one or more of the TxDAC 240, BB VGA 232, RF VGA 236 and driver amplifier circuit DA1 238 have 256 gain stages which correspond to a set of 255 transistors in the TxDAC 240, BB VGA 232, RF VGA 236 and driver amplifier circuit DA1 238. By turning these transistors on or off, the digital control block 250 can regulate the power consumption level of each of the TxDAC 240, BB VGA 232, RF VGA 236 and driver amplifier circuit DA1 238, which result in regulating the power consumption of the overall transmitter 210. Following block 340, the flow is then returned to block 300 of FIG. 3A.

Figure 3C:
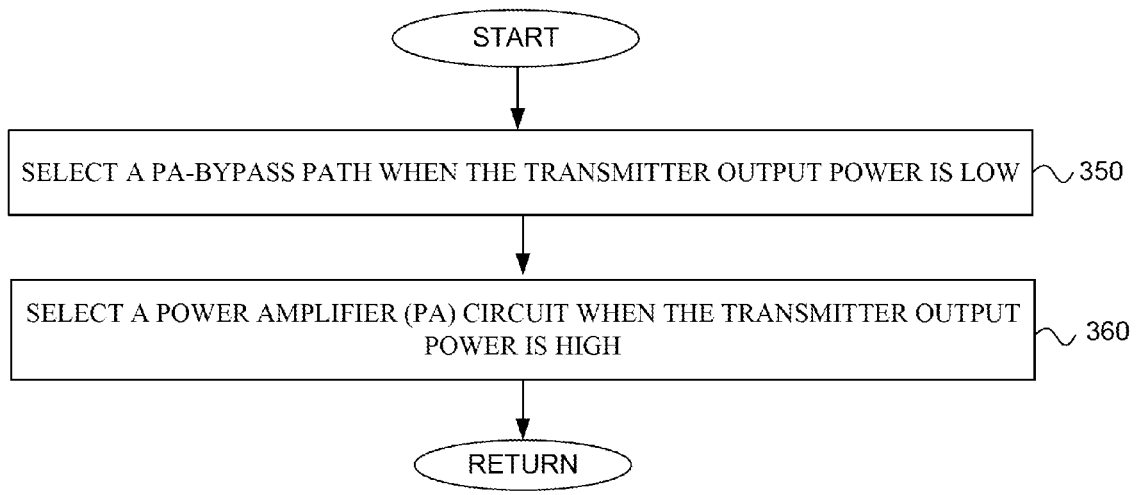

FIG. 3C is a flow chart illustrating in further detail the operations in block 300 of FIG. 3A. The process begins in block 350 in which a PA-bypass path 246 is selected when the transmitter 210 output power is low. In an exemplary embodiment, the selection is made by the digital control block 250 via control instructions 251*e* which open the switch 241*a* and close switches 241*b* and 241*c*. In an exemplary embodiment, the PA circuit 244 is also turned off when the transmitter output power is low, such as via control instructions 248 received from the MSM 220. Next, in block 360, the PA circuit 244 is selected when the transmitter 210 output power is high. In an exemplary embodiment, the selection is made by the digital control block 250 via control instructions 251*e* which closes the switch 241*a* and opens switches 241*b* and 241*c*. Following block 360, the flow is then returned to block 300 of FIG. 3A.

Figure 3D:
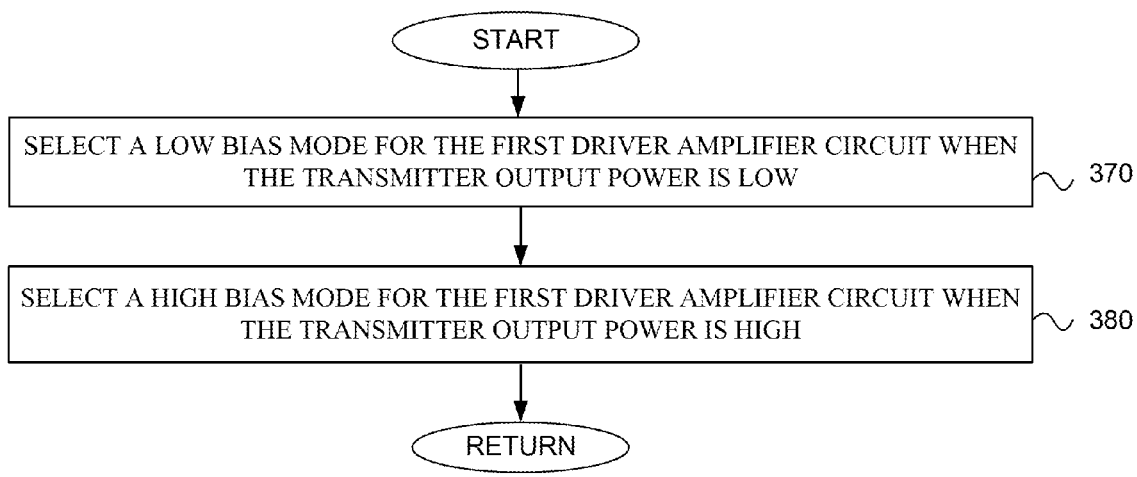

FIG. 3D is a flow chart illustrating in further detail the operations in block 310 of FIG. 3A. The process begins in block 370 in which a low bias mode is selected for the driver amplifier circuit DA1 238 when the transmitter 210 output power is low. In an exemplary embodiment, the selection is made by the digital control block 250 via control instructions 251*d*. Next, in block 380, a high bias mode is selected for the driver amplifier circuit DA1 238 when the transmitter 210 output power is high. In an exemplary embodiment, the selection is made by the digital control block 250 via control instructions 251*d*. Following block 380, the flow is then returned to block 310 of FIG. 3A.

In an exemplary embodiment, the operations described in conjunctions with FIGS. 3A-D are performed together. For example following the receipt of a control signal 226*a* in which the MSM 220 has opted for a low output power scenario for the transmitter 210, the digital control block 250 first maps the control signal 226*a* to predetermined current consumption characteristics of the TxDAC 240, BB VGA 232, RF VGA 236 and driver amplifier circuit DA1 238. The digital control block 250 then instructs each of the TxDAC 240, BB VGA 232, RF VGA 236 and driver amplifier circuit DA1 238 to operate in a gain state corresponding to the mapped characteristic by turning on or off a number of their transistors. The digital control block 250 also instructs selection of PA-bypass path 246 by opening of switch 241*a* and closing of switches 241*b* and 241*c*. The MSM 220 also turns off PA circuit 244 via instructions 248. The digital control block 250 also selects a low bias mode for the driver amplifier circuit DA1 238 via control instructions 251*d*.

Figure 4:
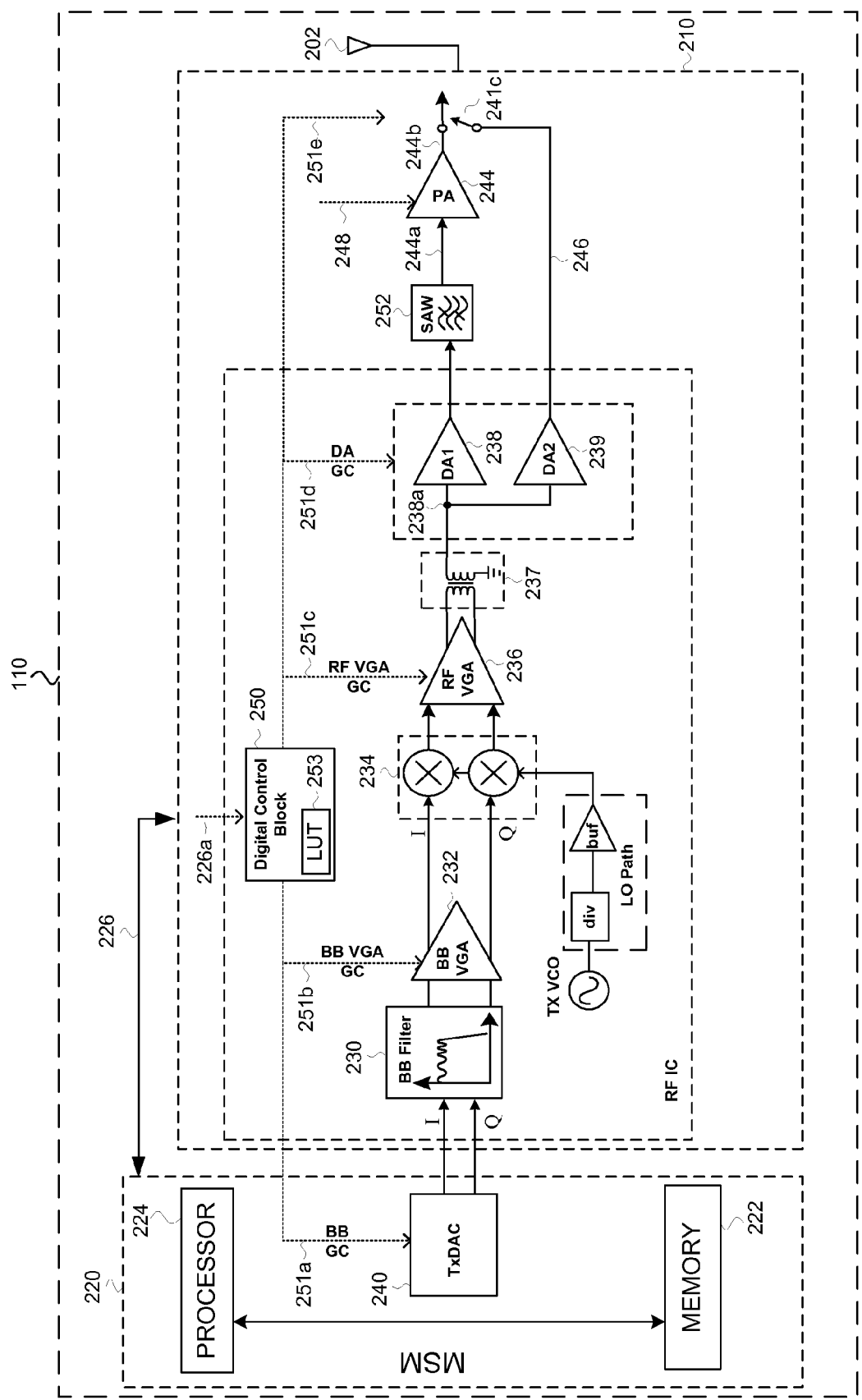
FIG. 4 illustrates another exemplary embodiment of the disclosure.

FIG. 4 illustrates another exemplary embodiment of the disclosure wherein components having the same numerals as those identified in FIG. 2 operate in substantially the same manner. In this exemplary embodiment, however, the transmitter circuit includes a second driver amplifier circuit DA2 239 which has a common input 238*a* with the driver amplifier circuit DA1 238. As with the driver amplifier circuit DA1 238 described above in conjunction with FIG. 2, the digital control block 250, based on a received signal 226*a* instructs the driver amplifier circuit DA2 239 to operate in a bias-mode selected from a plurality of bias-modes to regulate power consumption of the transmitter 210. The transmitter 210 shown in FIG. 4 has a switch 241*c* positioned between the output of the driver amplifier circuits DA2 239 and the output 244*b* of PA circuit 244 to enable selection of the PA-bypass path 246. As with the driver amplifier circuit DA1 238, the driver amplifier circuit DA2 239 has a plurality of gain stages, such as three or more which correspond to a set of transistors in driver amplifier circuit DA2 239. In an exemplary embodiment the driver amplifier circuit DA2 239 has 256 gain stages which correspond to a set of 255 transistors in the driver amplifier circuit DA2 239. By turning these transistors on or off, the digital control block 250 can regulate the power consumption level of the driver amplifier circuit DA2 239, which results in regulating the power consumption of the overall transmitter 210.

Figure 5A:
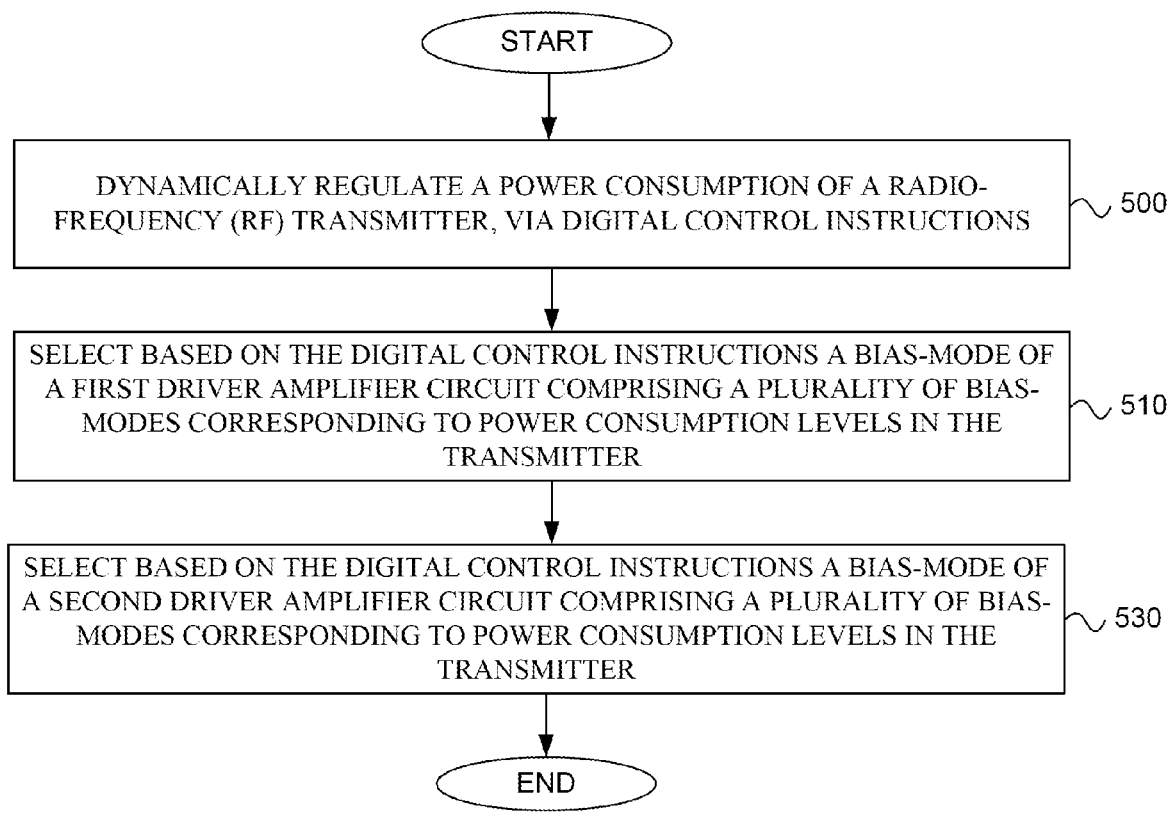
FIGS. 5A-C are flow charts illustrating exemplary methods of the disclosure.

FIGS. 5A-D are flow charts which in conjunction with FIG. 4 above illustrate exemplary methods of the disclosure. As shown in FIG. 5A, the overall process begins in block 500 where the power consumption of a radio-frequency (RF) transmitter 210 is dynamically regulated via digital control instructions, such as those received from the digital control block 250. In an exemplary embodiment, the digital control instructions include, but are not limited to: base band (BB) gain control (GC) instruction 251*a* to TxDAC 240, BB-VGA-GC instruction 251*b* to BB VGA 232, RF gain control (GC) instructions 251*c* RF VGA 236 and gain control (GC) instructions 251*d* to driver amplifier circuits DA1 238 and DA2 239, as well as command instructions 251*e* for opening or closing switch 241*c*. In an exemplary embodiment, the control instructions 251*a-e* are 8-bits. Next in block 510, based on the digital control instructions 251*d*, a bias-mode of the driver amplifier circuit DA1 238 is selected from a plurality of bias modes of driver amplifier circuit DA1 238, such a high-bias mode or a low-bias mode. Next in block 530, based on the digital control instructions 251*d*, a bias-mode of the driver amplifier circuit DA2 239 is selected from a plurality of bias modes of driver amplifier circuit DA2 239, such a high-bias mode or a low-bias mode. In an exemplary embodiment, the plurality of bias-modes correspond to operating power consumption levels in the driver amplifier circuits DA1 238 and DA2 239, and therefore the overall operating power consumption levels in the transmitter 210. The overall process then ends.

Figure 5B:
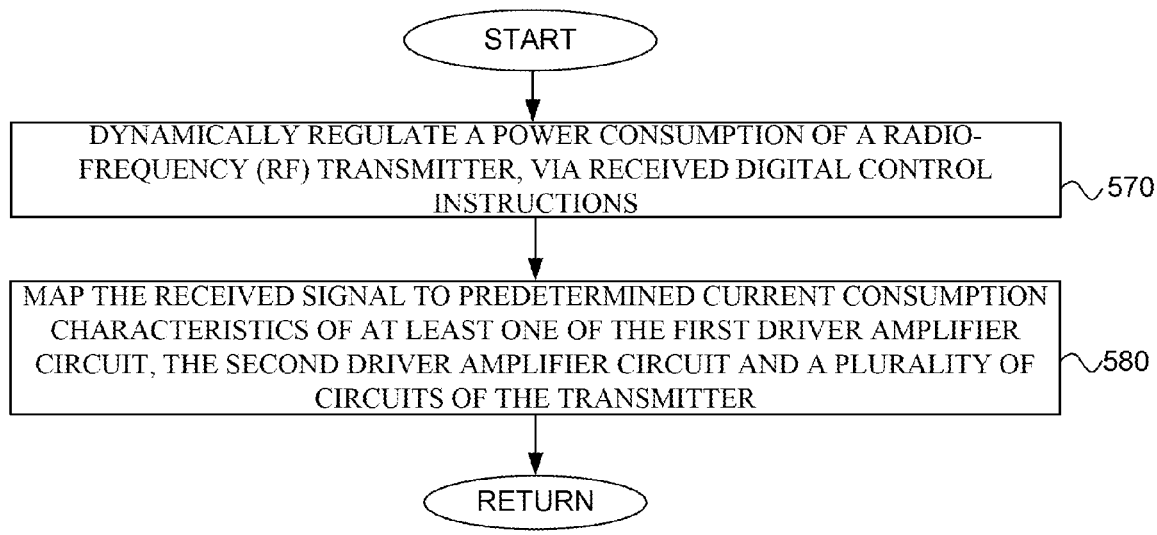

FIG. 5B is a flow chart illustrating in further detail the operations in block 500 of FIG. 5A. The process begins in block 570 in which the power consumption of a radio-frequency (RF) transmitter 210 is dynamically regulated via received digital control instructions, such as the digital control instructions 226a received in digital control block 250 from the MSM 220. In an exemplary embodiment, the received digital control instructions 226a are 8-bits.

Next, in block 580, the received signal 262a is mapped by the digital control block 250 to predetermined current consumption characteristics of one or more of: the TxDAC 240, BB VGA 232, RF VGA 236 and driver amplifier circuits DA1 238 and DA2 239. The mapping determines at what current level should each of the TxDAC 240, BB VGA 232, RF VGA 236 and driver amplifier circuits DA1 238 and DA2 239 operate so that the overall power consumption of the transmitter 210 be in line with the power consumption level requested by the MSM 220 via the received signal 262a. In an exemplary embodiment, a look up table (LUT) 253, which may be internal or external to digital control block 250 is used for the mapping.

In an exemplary embodiment, one or more of the TxDAC 240, BB VGA 232, RF VGA 236 and driver amplifier circuits DA1 238 and DA2 239 have a plurality of gain stages, such as three or more which correspond to a set of transistors in the TxDAC 240, BB VGA 232, RF VGA 236 and driver amplifier circuits DA1 238 and DA2 239. In an exemplary embodiment one or more of the TxDAC 240, BB VGA 232, RF VGA 236 and driver amplifier circuits DA1 238 and DA2 239 have 256 gain stages which correspond to a set of 255 transistors in the TxDAC 240, BB VGA 232, RF VGA 236 and driver amplifier circuits DA1 238 and DA2 239. By turning these transistors on or off, the digital control block 250 can regulate the power consumption level of each of the TxDAC 240, BB VGA 232, RF VGA 236 and driver amplifier circuits DA1 238 and DA2 239, which result in regulating the power consumption of the overall transmitter 210. Following block 340, the flow is then returned to block 500 of FIG. 5A.

Figure 5C:
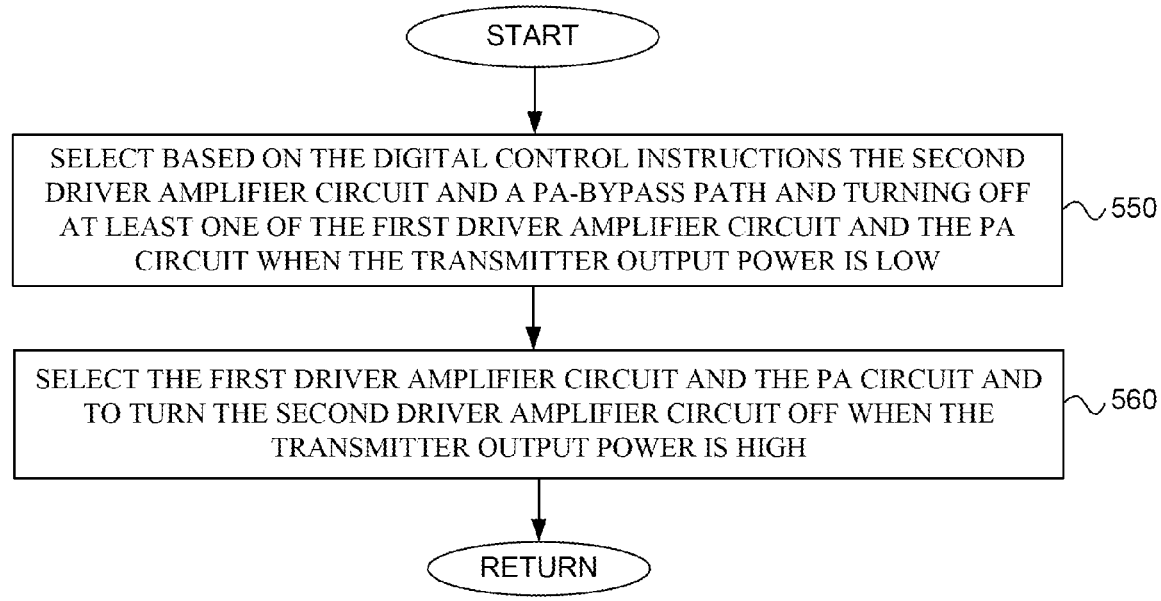

FIG. 5C is a flow chart illustrating in further detail the operations in blocks 510 and 530 of FIG. 5A. The process begins in block 550, in which when the transmitter 210 output power is low, the driver amplifier circuit DA2 239 and a PA-bypass path 246 are selected, the switch 241c is closed, and one or both of the driver amplifier circuit DA1 238 and the PA circuit 242 are turned off. In an exemplary embodiment, the selection is made by the digital control block 250 via control instructions 251d and 251e. Next, in block 560, when the transmitter 210 output power is high, driver amplifier circuit DA1 238 and the PA circuit 242 are selected and the driver amplifier circuit DA2 239 is turned off In an exemplary embodiment, the switch 241c is opened when the transmitter 210 output power is high. In an exemplary embodiment, the selection is made by the digital control block 250 via control instructions 251d and 251e. Because the selection of which of the PA circuit 244 or the PA bypass path 246 is done by turning of either the driver amplifier circuit DA1 238 or the driver amplifier circuit DA2 239, implementation of switches 241a and 241b shown in FIG. 2 are no longer needed. Following block 560, the flow is then returned to blocks 510 and 530 of FIG. 5A.

It should be noted that the various exemplary embodiments were discussed separately for purposes of illustrations, but that they may be combined in one embodiment having some or all of the features of the separately illustrated embodiments.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

It should be noted that the methods described above can be implemented in computer program product having a computer-readable medium with code for causing a computer to perform the above described processes. In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but are to be accorded the widest scope consistent with the principles and novel features disclosed herein.

What is claimed is:

1. A radio-frequency (RF) transmitter comprising:
a digital control block for dynamically regulating power consumption of the transmitter; and
a first driver amplifier circuit configured to receive at least one digital control instruction from the digital control block and comprising a plurality of bias-modes each corresponding to a power consumption level in the transmitter, the digital control block to instruct the first driver amplifier circuit via the at least one digital control instruction to operate in a selected bias-mode based on a measured output power level of the transmitter to regulate power consumption of the transmitter.

2. The RF transmitter of claim 1, the digital control block to instruct a plurality of circuits for regulating power consumption of the transmitter.

3. The RF transmitter of claim 2, the plurality of circuits comprising at least one of a base-band digital to analog converter, a base-band variable gain amplifier, a RF variable gain amplifier.

4. The RF transmitter of claim 2, the digital control block causes a reduction in a current consumption of at least one of the plurality of circuits when a transmitter output power decreases.

5. The RF transmitter of claim 1, the digital control block to select a high bias mode for the first driver amplifier circuit when the transmitter output power is high.

6. The RF transmitter of claim 1, the digital control block to select a low bias mode for the first driver amplifier circuit when the transmitter output power is low.

7. The RF transmitter of claim 1, further comprising:
a power amplifier (PA) circuit having an input for receiving an RF signal from the first driver amplifier circuit, and an output for outputting an amplified RF signal;
a PA-bypass path for connecting an output of the first driver amplifier circuit to the output of the PA circuit; and
a plurality of switches positioned between the output of the first driver amplifier circuit and the output of PA circuit to enable selection of the PA-bypass path.

8. The RF transmitter of claim 7, the power amplifier (PA) circuit is turned off when the transmitter output power is low.

9. The RF transmitter of claim 7, further comprising:
a surface acoustic wave (SAW) filter positioned between the output of the first driver amplifier circuit and the input of the PA circuit to filter the RF signal provided to the PA circuit by the first driver amplifier circuit.

10. The RF transmitter of claim 1, the first driver amplifier circuit comprising a plurality of gain states.

11. The RF transmitter of claim 1, the first driver amplifier circuit comprising 256 gain states.

12. The RF transmitter of claim 2, the plurality of circuits each comprising a plurality of gain states.

13. The RF transmitter of claim 1, comprising:
a second driver amplifier circuit comprising a plurality of bias-modes each corresponding to the power consumption level in the transmitter, the digital control block to instruct the second driver amplifier circuit to operate in a selected bias-mode to regulate power consumption of the transmitter, the first and second amplifier circuit having a common input;
a power amplifier (PA) circuit having an input for receiving an RF signal from the first driver amplifier circuit, and an output for outputting an amplified RF signal;
a PA-bypass path for connecting an output of the second driver amplifier circuit to the output of the PA circuit; and
at least one switch positioned between the output of the second driver amplifier circuits and the output of PA circuit to enable selection of the PA-bypass path.

14. The RF transmitter of claim 13, at least one of the first and second driver amplifier circuits each comprising a plurality of gain states.

15. The RF transmitter of claim 14, at least one of the first and second driver amplifier circuits comprising 256 gain states.

16. The RF transmitter of claim 13, the digital control block to select the second driver amplifier circuit and the PA-bypass path and to turn off at least one of the first driver amplifier circuit and the PA circuit when the transmitter output power is low.

17. The RF transmitter of claim 13, the digital control block to select the first driver amplifier circuit and the PA circuit and to turn the second driver amplifier circuit off when the transmitter output power is high.

18. The RF transmitter of claim 2, the digital control block to regulate power consumption of the transmitter based on a received signal.

19. The RF transmitter of claim 18, the digital control block to map the received signal to predetermined current consumption characteristics of at least one of the first driver amplifier circuit and the plurality of circuits to regulate power consumption of the transmitter.

20. The RF transmitter of claim 19, the digital control block to map the received signal to predetermined current consumption characteristics of at least one of the first driver amplifier circuit, the second driver amplifier circuit and the plurality of circuits to regulate power consumption of the transmitter.

21. A method comprising:
dynamically regulating a power consumption of a radio-frequency (RF) transmitter, via digital control instructions received at a first driver amplifier and based on a measured output power level of the transmitter; and
selecting based on the digital control instructions a bias-mode of the first driver amplifier circuit comprising a plurality of bias-modes corresponding to power consumption levels in the transmitter.

22. The method of claim 21, the selecting further comprising:
  selecting a low bias mode for the first driver amplifier circuit when the transmitter output power is low; and
  selecting a high bias mode for the first driver amplifier circuit when the transmitter output power is high.

23. The method of claim 21, further comprising:
  selecting a PA-bypass path when the transmitter output power is low; and
  selecting a power amplifier (PA) circuit when the transmitter output power is high.

24. The method of claim 21, the selecting a PA-bypass path further comprising:
  turning off the PA circuit when the transmitter output power is low.

25. The method of claim 21, further comprising:
  selecting based on the digital control instructions a bias-mode of a second driver amplifier circuit comprising a plurality of bias-modes corresponding to power consumption levels in the transmitter.

26. The method of claim 25, further comprising:
  selecting based on the digital control instructions the second driver amplifier circuit and a PA-bypass path and turning the first driver amplifier circuit and the PA circuit off when the transmitter output power is low; and
  selecting the first driver amplifier circuit and the PA circuit and to turn the second driver amplifier circuit off when the transmitter output power is high.

27. The method of claim 21, the dynamically regulating a power consumption of a radio-frequency (RF) transmitter, via digital control instructions further comprising:
  dynamically regulating a power consumption of a radio-frequency (RF) transmitter, via received digital control instructions; and
  mapping the received signal to predetermined current consumption characteristics of at least one of the first driver amplifier circuit and a plurality of circuits of the transmitter.

28. The method of claim 25, the dynamically regulating a power consumption of a radio-frequency (RF) transmitter, via digital control instructions further comprising:
  dynamically regulating a power consumption of a radio-frequency (RF) transmitter, via received digital control instructions; and
  mapping the received signal to predetermined current consumption characteristics of at least one of the first driver amplifier circuit, the second driver amplifier circuit and a plurality of circuits of the transmitter.

29. An apparatus comprising:
  means for dynamically regulating a power consumption of a radio-frequency (RF) transmitter, via digital control instructions received at a first driver amplifier and based on a measured output power level of the transmitter;
  means for selecting based on the digital control instructions a bias-mode of the first driver amplifier circuit comprising a plurality of bias-modes corresponding to power consumption levels in the transmitter; and
  means for operating the first driver amplifier circuit in the selected bias-mode.

30. The apparatus of claim 29, further comprising:
  means for selecting a low bias mode for the first driver amplifier circuit when the transmitter output power is low; and
  means for selecting a high bias mode for the first driver amplifier circuit when the transmitter output power is high.

* * * * *